(12) United States Patent
Zieman et al.

(10) Patent No.: US 7,957,133 B2
(45) Date of Patent: Jun. 7, 2011

(54) METHOD AND APPARATUS FOR PROVIDING THERMAL MANAGEMENT IN AN ELECTRONIC DEVICE

(75) Inventors: Christopher E. Zieman, Felton, CA (US); Todd Mason, Livermore, CA (US)

(73) Assignee: Cisco Technology, Inc., San Jose, CA (US)

( * ) Notice: Subject to any disclaimer, the term of this patent is extended or adjusted under 35 U.S.C. 154(b) by 306 days.

(21) Appl. No.: 12/129,246

(22) Filed: May 29, 2008

(65) Prior Publication Data

US 2008/0225479 A1    Sep. 18, 2008

Related U.S. Application Data

(62) Division of application No. 11/583,385, filed on Oct. 19, 2006, now Pat. No. 7,394,654.

(51) Int. Cl.
*G06F 1/20* (2006.01)
*H05K 7/20* (2006.01)

(52) U.S. Cl. ......... 361/679.51; 361/679.48; 361/679.49; 361/679.5; 361/692; 361/694; 361/695; 361/720; 361/721; 312/236; 454/184

(58) Field of Classification Search ............ 361/679.48–679.51, 690, 692, 361/694–695, 720–721, 724; 165/80.3, 104.33, 165/121–122; 312/223.2, 236; 454/184
See application file for complete search history.

(56) References Cited

U.S. PATENT DOCUMENTS

| | | | |
|---|---|---|---|
| 3,147,403 A | | 9/1964 | Cressman et al. |
| 3,874,444 A | | 4/1975 | Perce et al. |
| 4,122,828 A | * | 10/1978 | DiPeri .......................... 126/671 |
| 5,375,038 A | | 12/1994 | Hardt |
| 5,431,009 A | * | 7/1995 | Bauver, II .................. 60/39.182 |

(Continued)

FOREIGN PATENT DOCUMENTS

DE    4128047 A1 *    2/1993

(Continued)

OTHER PUBLICATIONS

Christopher W. Argento, et al., "Forced Convection Air-Cooling of a Commercial Electronic Chassis: An Expirimental and Computational Case Study," IEEE Transaction on Components, Packaging, and Manufacturing Technology, Part A, vol. 19, No. 2, Jun. 1996, pp. 248-257.

(Continued)

*Primary Examiner* — Jayprakash N Gandhi
*Assistant Examiner* — Robert J Hoffberg
(74) *Attorney, Agent, or Firm* — BainwoodHuang

(57) ABSTRACT

An electronic system includes a chassis, an air flow distribution assembly having a first set of baffles disposed within an intake volume of the chassis and a second set of baffles disposed in proximity to an air outlet of the chassis. The first set of baffles is configured to turn the flow of an air stream approximately 90 degrees, relative to an inlet flow direction of the air stream, toward circuit boards disposed within the chassis. The second set of baffles is configured as a flow splitter that receives the air stream from the circuit boards and partitions the air stream into separate portions prior to the air stream exiting via the air outlet. The use of both the first and second set of baffles redirects and distributes the air stream, flowing into the air inlet, in a substantially even manner across the circuit board component mounting surfaces of the circuit boards disposed within the system.

11 Claims, 5 Drawing Sheets

U.S. PATENT DOCUMENTS

| | | | |
|---|---|---|---|
| 5,751,550 A | 5/1998 | Korinsky | |
| 5,914,858 A | 6/1999 | McKeen et al. | |
| 5,995,368 A | 11/1999 | Lee et al. | |
| 6,011,688 A | 1/2000 | Thornburg et al. | |
| 6,104,607 A | 8/2000 | Behl | |
| 6,222,729 B1 | 4/2001 | Yoshikawa | |
| 6,359,779 B1 | 3/2002 | Frank, Jr. et al. | |
| 6,377,470 B1 * | 4/2002 | Hayward et al. | 361/796 |
| 6,381,147 B1 * | 4/2002 | Hayward et al. | 361/756 |
| 6,442,024 B1 | 8/2002 | Shih | |
| 6,556,438 B1 | 4/2003 | Bolognia et al. | |
| 6,565,428 B2 | 5/2003 | Hsaio | |
| 6,646,878 B2 * | 11/2003 | Chan | 361/695 |
| 6,813,149 B2 | 11/2004 | Faneuf et al. | |
| 6,912,129 B2 | 6/2005 | Baker et al. | |
| 6,912,131 B2 * | 6/2005 | Kabat | 361/720 |
| 6,927,976 B1 | 8/2005 | Malone et al. | |
| 7,079,387 B2 * | 7/2006 | Brooks et al. | 361/679.51 |
| 7,259,961 B2 * | 8/2007 | Lucero et al. | 361/695 |
| 7,355,850 B2 * | 4/2008 | Baldwin, Jr. | 361/695 |
| 7,394,654 B2 * | 7/2008 | Zieman et al. | 361/695 |
| 7,420,806 B1 * | 9/2008 | Lima et al. | 361/695 |
| 7,633,754 B1 * | 12/2009 | Mumper | 361/695 |
| 7,813,121 B2 * | 10/2010 | Bisson et al. | 361/679.51 |
| 2005/0286222 A1 * | 12/2005 | Lucero et al. | 361/690 |
| 2007/0125518 A1 | 6/2007 | Kumar et al. | |
| 2007/0230119 A1 | 10/2007 | Baldwin, Jr. | |
| 2009/0109619 A1 * | 4/2009 | Wise et al. | 361/695 |

FOREIGN PATENT DOCUMENTS

| | | | |
|---|---|---|---|
| JP | 07327102 A | * | 12/1995 |
| JP | 2002352622 A | * | 12/2002 |
| KR | 20020089627 A | | 11/2002 |
| SU | 1476628 A | * | 4/1989 |

OTHER PUBLICATIONS

Argento, "Forced Convection Air Cooling of a Commercial Electronic Chassis: An Experimental and Computational Case Study," M.S. thesis, University of Maryland, College Park, MD, 1994.

* cited by examiner

METHOD AND APPARATUS FOR PROVIDING THERMAL MANAGEMENT IN AN ELECTRONIC DEVICE

CROSS REFERENCE TO RELATED APPLICATIONS

This patent application is a Divisional of U.S. patent application Ser. No. 11/583,385 filed on Oct. 19, 2006, entitled, "METHOD AND APPARATUS FOR PROVIDING THERMAL MANAGEMENT IN AN ELECTRONIC DEVICE," the contents and teachings of which are hereby incorporated by reference in their entirety.

BACKGROUND

Electronic systems, such as computer systems, typically include one or more circuit boards housed within a cabinet. The circuit boards are often arranged vertically within the cabinet, in a side-by-side manner. During operation, the circuit boards can generate a significant amount of heat. With the arrangement of the circuit boards within the cabinet, unless the heat is removed, thermal damage can occur to circuit board components carried by the circuit boards. Typically, the electronics systems are cooled by a fan assembly placed within the cabinet of the electronics system to remove the heat generated by the circuit boards.

While the electronic systems can be configured to cool their associated circuit boards in a variety of ways, certain electronic systems are configured with a front-to-back cooling system. In conventional front-to-back cooled systems, a fan assembly causes air to enter the cabinet through an opening located at the base of the front side of the cabinet. As the air flows through the cabinet and across the vertically arranged circuit boards, the air absorbs heat generated by the circuit board components thereby reducing the temperature of the operational circuit board components. The fan assembly draws heated air from the circuit boards to an exhaust opening located at top of the rear side of the cabinet. As a result, front-to-back cooling systems provide a level of thermal management to the circuit boards carried by the electronic systems.

SUMMARY

Embodiments of the present invention relate to a method and apparatus for providing thermal management to electronic components in a front-to-back cooled electronic system. A front-to-back cooled electronic system includes a chassis, an air flow distribution assembly having a first set of baffles disposed within an intake volume of the chassis and a second set of baffles disposed in proximity to an air outlet of the chassis. The first set of baffles is configured to turn the flow of the air stream approximately 90 degrees, relative to an inlet flow direction of the air stream, toward circuit boards disposed within the chassis. The second set of baffles is configured as a flow splitter that receives the air stream flowing from the circuit boards and partitions the air stream into separate portions prior to the air stream exiting via the air outlet. The use of both the first and second set of baffles redirects and distributes the air stream, flowing into the air inlet, in a substantially even manner across the circuit board component mounting surfaces of the circuit boards disposed within the system, from a front air inlet portion of the chassis to a rear air outlet portion of the chassis. By distributing the air stream across the circuit board surfaces in a substantially even manner, from front to rear, the first and second sets of baffles minimize recirculation of the air stream within the chassis to maximize cooling of the circuit boards during use.

In one arrangement, a chassis, configured to receive a circuit board, includes a first wall defining an air inlet in proximity to a chassis base and an opposing second wall defining an air outlet in proximity to a chassis cover, the chassis cover opposing the chassis base. The chassis includes a first set of baffles disposed within the chassis between the first wall and the second wall. Each baffle of the first set of baffles is configured to direct at least a portion of an air stream flowing through the air inlet from a first direction to a second direction toward the circuit board such that the air stream flows substantially parallel to a planar surface of the circuit board where the first direction is substantially orthogonal to each baffle of the first set of baffles and the second direction is substantially orthogonal to the first direction. The chassis includes a second set of baffles disposed in proximity to the air outlet, the second set of baffles being configured to divide the air stream flowing substantially parallel to the planar surface of the circuit board into a plurality of air streams In one arrangement, a chassis, configured to receive a circuit board, includes a first wall defining an air inlet in proximity to a chassis base and an opposing second wall defining an air outlet in proximity to a chassis cover, the chassis cover opposing the chassis base. The chassis includes a first set of baffles disposed within the chassis between the first wall and the second wall. Each baffle of the first set of baffles configured to direct at least a portion of an air stream flowing through the air inlet from a first direction to a second direction toward the circuit board such that the air stream flows substantially parallel to a planar surface of the circuit board where the first direction is substantially orthogonal to each baffle of the first set of baffles and the second direction is substantially orthogonal to the first direction. Each baffle element of the first set of baffles includes a first edge opposing the chassis cover and a second edge opposing the chassis base. The first edge of a first baffle element of the first set of baffles extends a first distance above the first edge of an adjacently positioned second baffle element and the second edge of the first baffle element of the first set of baffles extends a second distance above the second edge of the adjacently positioned second baffle element. A height of the first baffle element of the first set of baffles is substantially equal to a height of the second baffle element of the first set of baffles.

In one arrangement, a method for distributing air flow in a chassis includes directing at least a portion of an air stream flowing along a first direction relative to an air inlet defined by a first wall of the chassis, to a second direction toward a circuit board, disposed between the air inlet and an air outlet, such that the air stream flows substantially parallel to a planar surface of the circuit board. The method also includes dividing the air stream flowing substantially parallel to a planar surface of the circuit board, into a plurality of air streams.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF EXAMPLE EMBODIMENTS

Embodiments of the present invention relate to a method and apparatus for providing thermal management to electronic components in a front-to-back cooled electronic system. A front-to-back cooled electronic system includes a chassis, an air flow distribution assembly having a first set of baffles disposed within an intake volume of the chassis in proximity to an air inlet and a second set of baffles disposed in proximity to an air outlet of the chassis. The first set of baffles is configured to turn the flow of the air stream approximately 90 degrees, relative to an inlet flow direction of the air stream, toward circuit boards disposed within the chassis. The second set of baffles is configured as a flow splitter that receives the air stream along a direction substantially parallel to the planar surfaces circuit boards and partitions the air stream into separate portions prior to the air stream exiting via the air outlet. The use of both the first and second set of baffles redirects and distributes the air stream, flowing into the air inlet, in a substantially even manner across the circuit board component mounting surfaces of the circuit boards disposed within the system, from a front air inlet portion of the chassis to a rear air outlet portion of the chassis. By distributing the air stream across the circuit board surfaces in a substantially even manner, from front to rear, the first and second sets of baffles minimize recirculation of the air stream within the chassis to maximize cooling of the circuit boards during use.

Figure 1:
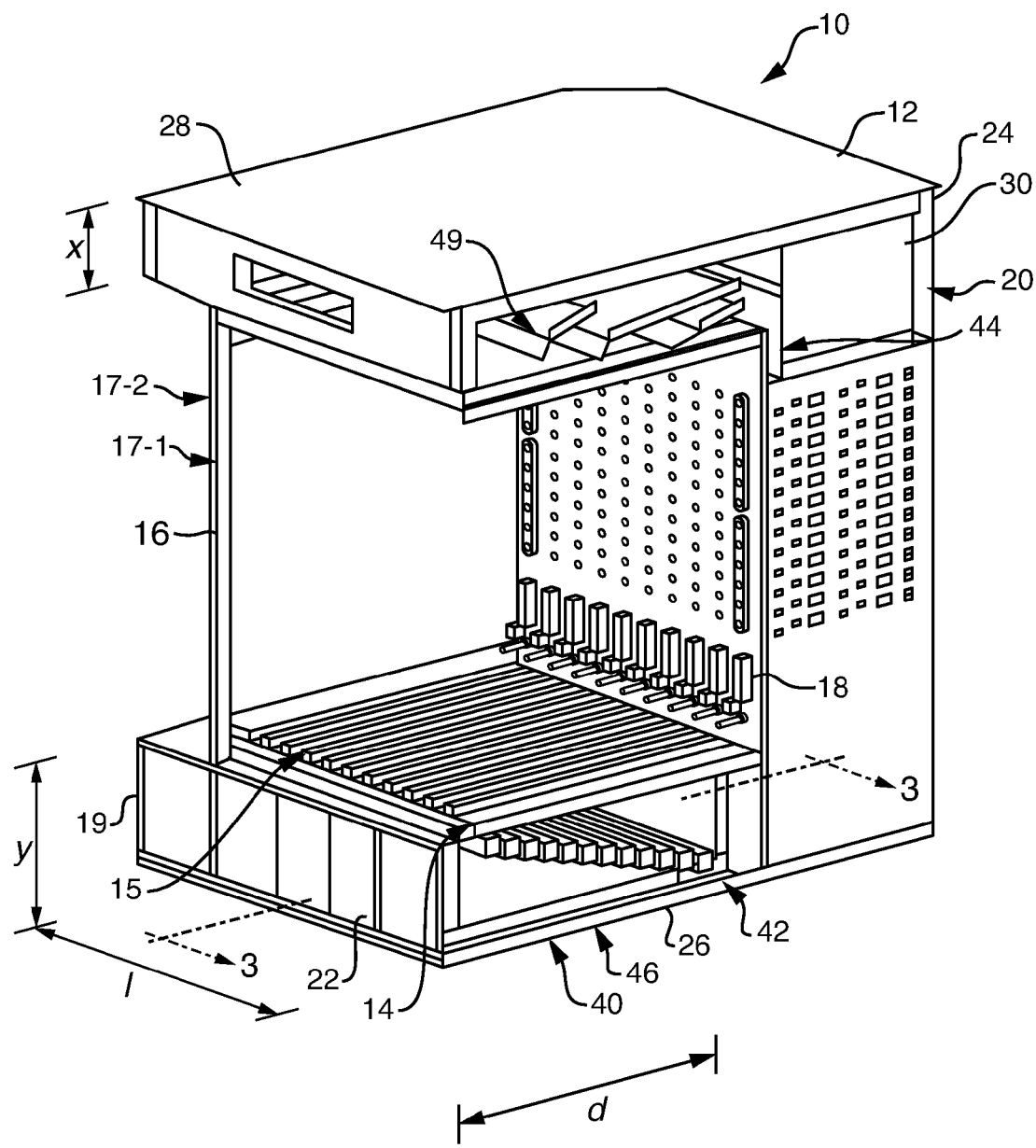
FIG. 1 illustrates a perspective cutaway view of an electronic device, according to one embodiment of the invention.
Figure 2:
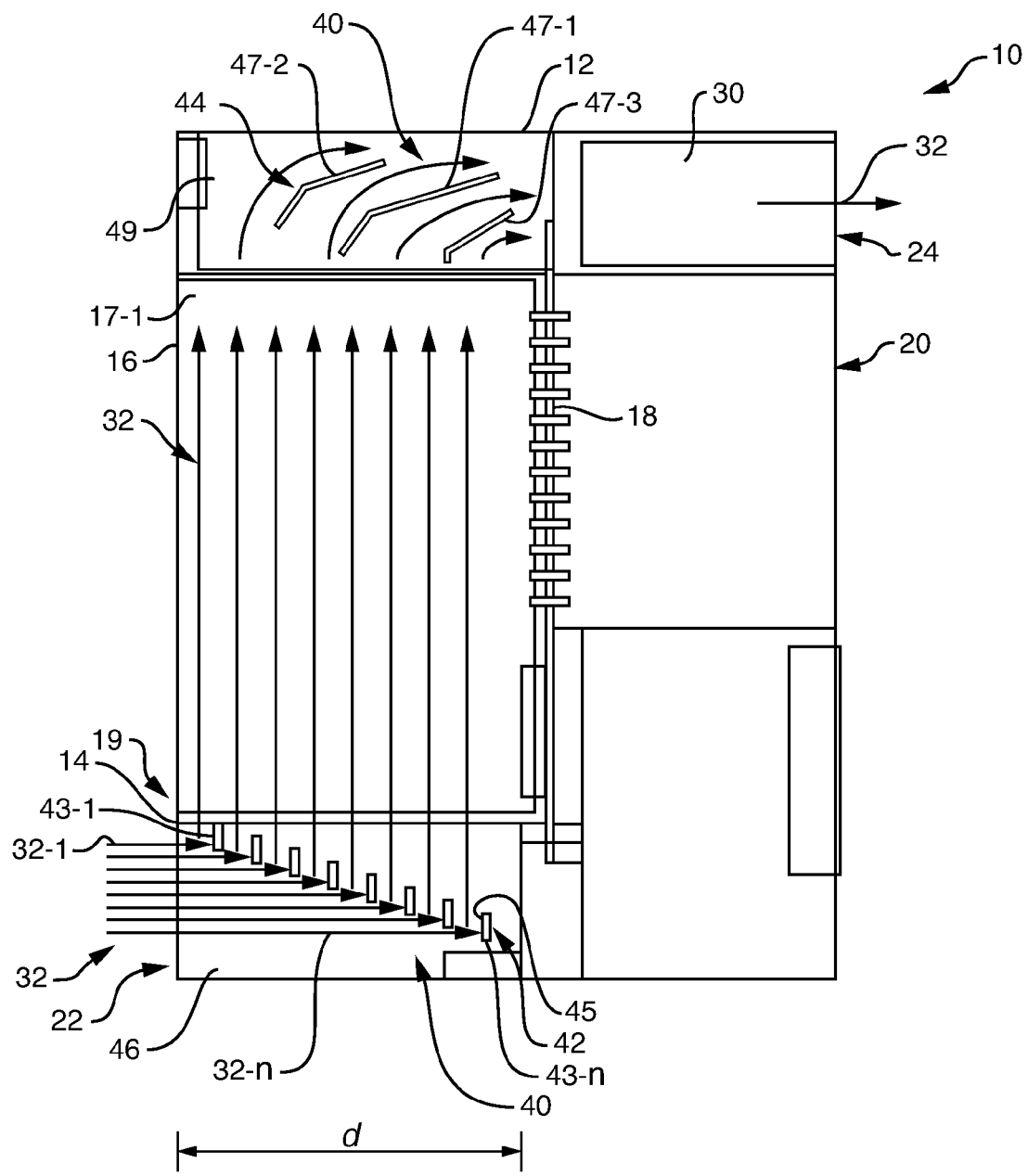
FIG. 2 illustrates a side cutaway view of an electronic device, according to one embodiment of the invention.

FIGS. 1 and 2 illustrate perspective cutaway and side cutaway views of an electronic device 10. The electronic device 10, such as a computer system, includes a chassis 12 which houses a card cage 14 having linecard slots 15. The card cage 14 holds one or more circuit boards 16 that are oriented vertically within the linecard slots 15, one beside the other, and that electrically couple with a backplane 18 of the electronic device 10. The chassis 12 also includes a first wall 19 that defines a first opening or air inlet 22 and an opposing second wall 20 that defines a second opening or air outlet 24. In one arrangement, the electronic device 10 is a front-to-back air-cooled electronic device where the air inlet 22 is disposed at a first end of the chassis 12, such as in proximity to (i.e., very near or close to) a base 26 of the chassis 12 and the air outlet 24 is disposed at an opposing second end of the chassis 12, such as in proximity to (i.e., very near or close to) a cover 28 of the chassis 12. In use, a fan assembly 30 draws an air stream 32 into the air inlet 22, through the chassis 12, and across the surfaces of the circuit boards 16, and exhausts the air through the air outlet 24. The terms inlet and outlet are used for convenience in order to distinguish the first and second openings and should not be construed as a limitation as to the direction of air flow within the chassis 12. One of ordinary skill in the art will understand that the air stream 32 can flow into and out from the chassis 12 through either the air inlet 22 or air outlet 24.

Also as shown in FIGS. 1 and 2, the chassis 12 includes an air flow distribution assembly 40 that is configured to provide substantially straight and even air flow across, and substantially parallel to, the planar circuit board component mounting surfaces 17-1, 17-2 of each of the circuit boards 16. In one arrangement, the air flow distribution assembly 40 includes two sets of baffles: a first set of baffles 42 disposed in proximity to the air inlet 22 and a second set of baffles 44 disposed in proximity to the air outlet 24.

In the arrangement illustrated in FIGS. 1 and 2, the first set of baffles 42 includes baffle elements 43-1 through 43-N, collectively baffle elements 43, that are disposed between the first wall 19 and the second wall 20 of the chassis 12 within an intake volume 46 defined by the chassis 12. For example, as shown in FIG. 1, the intake volume 46 extends in one direction along the length l of the chassis 12, in a second direction along the depth d of the chassis 12 (e.g., along a length of the card cage 14) between the first wall 19 and the midplane 18 and in a third direction along height Y. Each baffle element 43 includes a corresponding baffle face 45 oriented substantially perpendicular to a direction of flow of the air stream 32 through the air inlet 22. Also as indicated in FIGS. 1 and 2, the baffle elements 43 are disposed within the intake volume 46 below the card cage 14 and circuit boards 16 and extend across the intake volume 46 along a length l of the chassis 12. With such a configuration and positioning of the first set of baffles 42, each baffle element 43 is configured to direct the air stream 32 entering the air inlet 22 toward each of the circuit boards 16 disposed within the chassis 12.

As illustrated in FIG. 2, the air stream 32 flows through the air inlet 22 along a first direction that is substantially orthogonal to the baffle face 45 of each baffle element 43. As the air stream 32 contacts the first set of baffles 42, each baffle element 43 changes the flow direction of the distinct portion of the air stream 32 to a second direction, substantially parallel to the baffle face 45 of each baffle element 43 to direct the distinct portion of the air stream 32 towards the circuit boards 16. For example, as the air stream 32 flows into the air inlet 22, a portion of the air stream 32-1 approaches a first baffle element 43-1. As the air stream portion 32-1 contacts the first baffle element 43-1, the first baffle element 43-1 redirects the flow of the air stream 32-1 such that the air stream 32-1 flows toward the circuit board 16 along a direction that is substantially orthogonal to the original direction of the flow of the air stream portion 32-1 into the air inlet 22. Effectively, each baffle element 43 turns a corresponding portion of the air stream by approximately 90 degrees relative to the original direction of the flow of the air stream 32 through the air inlet 22.

As a result of turning the flow direction of the air steam 32 by 90 degrees, as indicated in FIG. 2, each baffle element 43-1 through 43-N redirects each air stream portion 32-1 through 32-N towards the circuit board 16 such that the distribution of the air stream 32 across the planar circuit board mounting surfaces 17-1, 17-2 of the circuit board 16 (e.g., along length d) is substantially uniform, from the front of the circuit board 16 closest to the first wall 19 to the rear of the circuit board 16 near the midplane 18 of the (e.g., front to back). Because the baffle elements 43 direct the air stream 32 across substantially evenly across the planar circuit board component mounting surfaces 17-1, 17-2 of the circuit board 16, the first set of baffles 42 minimize air recirculation within the chassis 12 to minimize localized hot spots on, and maximize cooling of, the circuit board 16 of the electronic device 10 during operation. Additionally, as indicated in FIG. 1, because the baffle elements 43 extend along the length l of the inlet volume 46 of the chassis 12, the baffle elements 43 redirect the air stream 32 flowing through the air inlet 22 to each circuit board 16 disposed within the chassis 12.

The air flow distribution assembly 40 also includes the second set of baffles 44 disposed in proximity to the air outlet 24 and within an outtake volume 49 defined by the first wall 19 of chassis 12 and the midplane 18. For example, as shown in FIG. 1, the outtake volume 49 extends in one direction along the length/of the chassis 12, in a second direction along the depth d of the chassis 12 between the first wall 19 and the midplane 18 (e.g., along a length of the card cage 14), and along height x. Returning to FIGS. 2 and 3, the second set of baffles 44 is operable to partition the air stream 32 flowing along a direction substantially parallel to the planar surfaces (e.g., circuit board component mounting surfaces) of the circuit boards 16 into separate portions prior to the air stream 32 exiting the chassis through the air outlet 24. As such, the second set of baffles 44 collectively act as flow splitters or pseudo-pipes that help to maintain the substantially even distribution of the air stream 32 across the planar circuit board component mounting surfaces 17-1, 17-2 of each circuit board 16 during operation.

Figure 3:
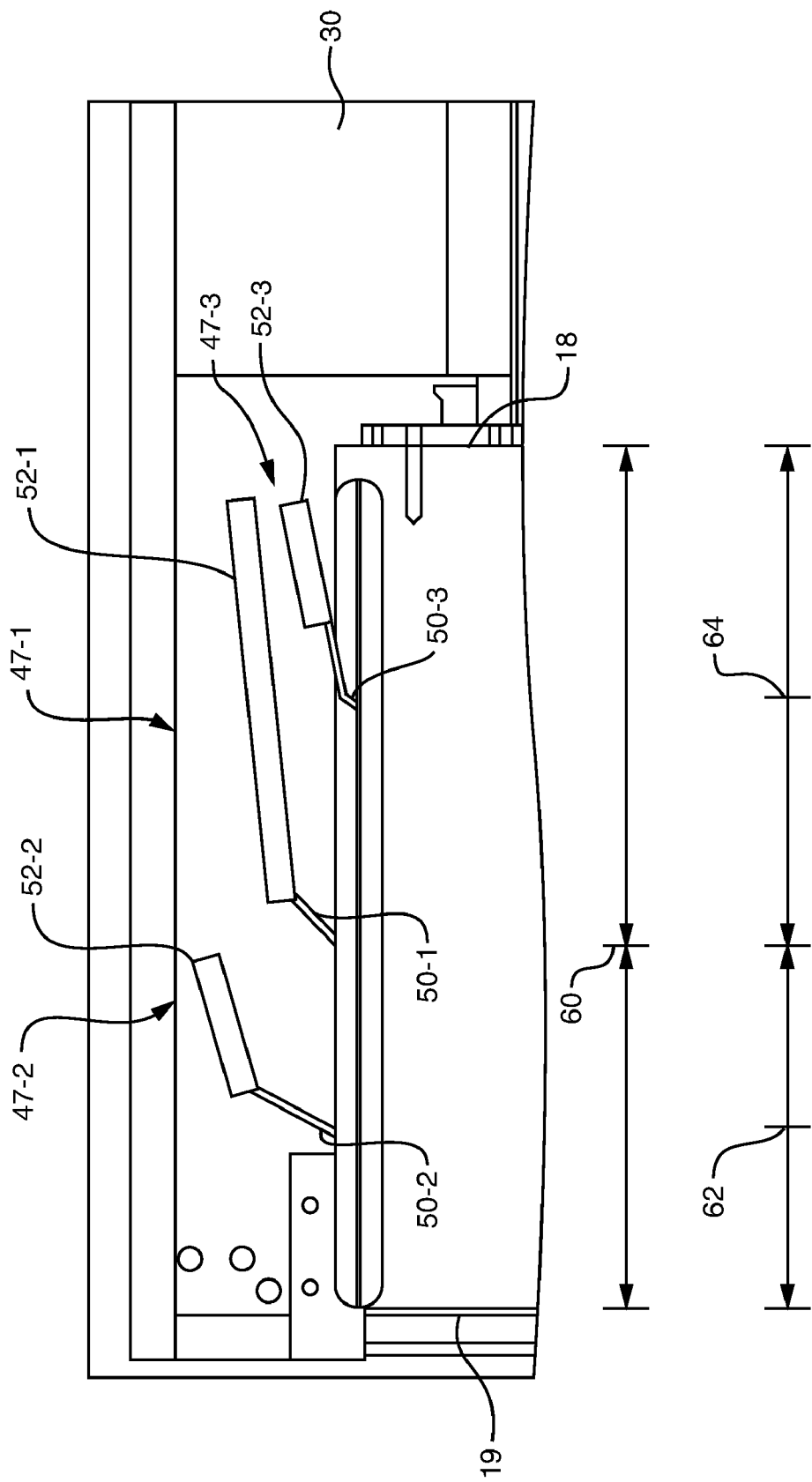
FIG. 3 illustrates a sectional view of a first set of baffles of the electronic device of FIG. 1, according to one embodiment of the invention.

While the second set of baffles 44 can include any number of baffle elements, in one arrangement, as shown in FIGS. 2 and 3, the second set of baffles 44 includes three baffle elements 47: a first baffle element 47-1 disposed between the first wall 19 and the second wall 20, a second baffle element 47-2 disposed between the first wall 19 and the first baffle element 47-1, and a third baffle element 47-3 disposed between the first baffle element 47-1 and the second wall 20, collectively baffle elements 47. The use of three baffle elements 47 as part of the second set of baffles 44, in addition to maintaining the substantially even distribution of the air stream 32 across the planar circuit board component mounting surfaces 17-1, 17-2 of each circuit board 16, minimizes a loss in pressure of the air stream 32 as it flows within the chassis 12 from the air inlet 22 to the air outlet 24. By minimizing pressure loss of the air stream 32, the three baffle elements 47 minimize stagnation of the air stream 32 within the chassis 12 during operation.

As indicated above, the second set of baffles 44 are operable to maintain the substantially even distribution of the air stream 32 across the planar circuit board component mounting surfaces 17-1, 17-2 of each circuit board 16. In one arrangement, the geometric configuration of the baffle elements 47 and the relative positioning of the baffle elements 47 within the chassis 12 provide flow splitting capability to maintain such substantially even distribution of the air stream 32 across the planar circuit board surfaces 17.

As shown in FIG. 3, each baffle element 47-1 through 47-3 is configured as a forked baffle element having a first member 50 extending toward the circuit boards 16 and a second member 52 extending toward the air outlet 24 of the chassis 12. The first member 50 of each baffle element 47-1 through 47-3 is disposed within the outtake volume 49 of chassis 12 to partition the air stream 32, flowing substantially parallel to the planar surface of the circuit boards 16, such that the air stream 32 is distributed in a substantially even manner relative to the outtake volume 49. For example, the first member 50-1 is disposed within the outtake volume 49 at a location 70 that is substantially one-half of a distance between the first wall 19 and the midplane 18, the second member 50-2 is disposed at a location 72 that is substantially one-half of a distance between the first wall 19 and the first member 50-1 of the first baffle element 47-1, and the third member 50-3 is disposed at a location 74 that is substantially one-half of a distance between the first member 50-1 of the first baffle element 47-1 and the midplane 18. Taking FIG. 3 in conjunction with FIG. 2, the three baffle members 50-1 through 50-3 divide the air stream 32 flowing substantially parallel to the planar surfaces of the circuit boards 16 into four substantially equal outlet air stream portions that are directed to the air outlet 24 by the corresponding second baffle members 52-1 through 52-3. Such substantially even division of the air stream 32 flowing from the circuit boards 16 helps to maintain the substantially even distribution of the air stream 32 across the planar circuit board component mounting surfaces 17-1, 17-2 of each circuit board 16 in conjunction with the first set of baffles 42. As such, the second set of baffles 44 help to minimize air recirculation within the chassis 12 to minimize localized hot spots on, and maximize cooling of, the circuit board 16 of the electronic device 10 during operation.

Because the first and second sets of baffles 42, 44 provide substantially even distribution of the air stream 32 across the planar surfaces 17-1, 17-2 of each circuit board 16, the use of the first and second sets of baffles 42, 44 can affect certain layout options associated with the electronic system 10. For example, because the sets of baffles 42, 44 minimize the presence of hot spots within the chassis 12 by distributing the air stream 32 in a substantially even manner therein, the sets of baffles 42, 44 allow the circuit board components to be distributed in a substantially even manner across each circuit board 16. As such, the circuit board components do not necessarily have to be placed in particular locations on the circuit board 16 to receive an adequate stream of air for cooling purposes. Additionally, the use of the first and second sets of baffles 42, 44 enables the intake and outtake volumes 46, 49 of the chassis 12 to be relatively shorter along length l and height Y, compared to conventional intake and outtake volumes, while providing an adequately distributed air stream 32 across vertically oriented circuit boards 16.

Figure 4:
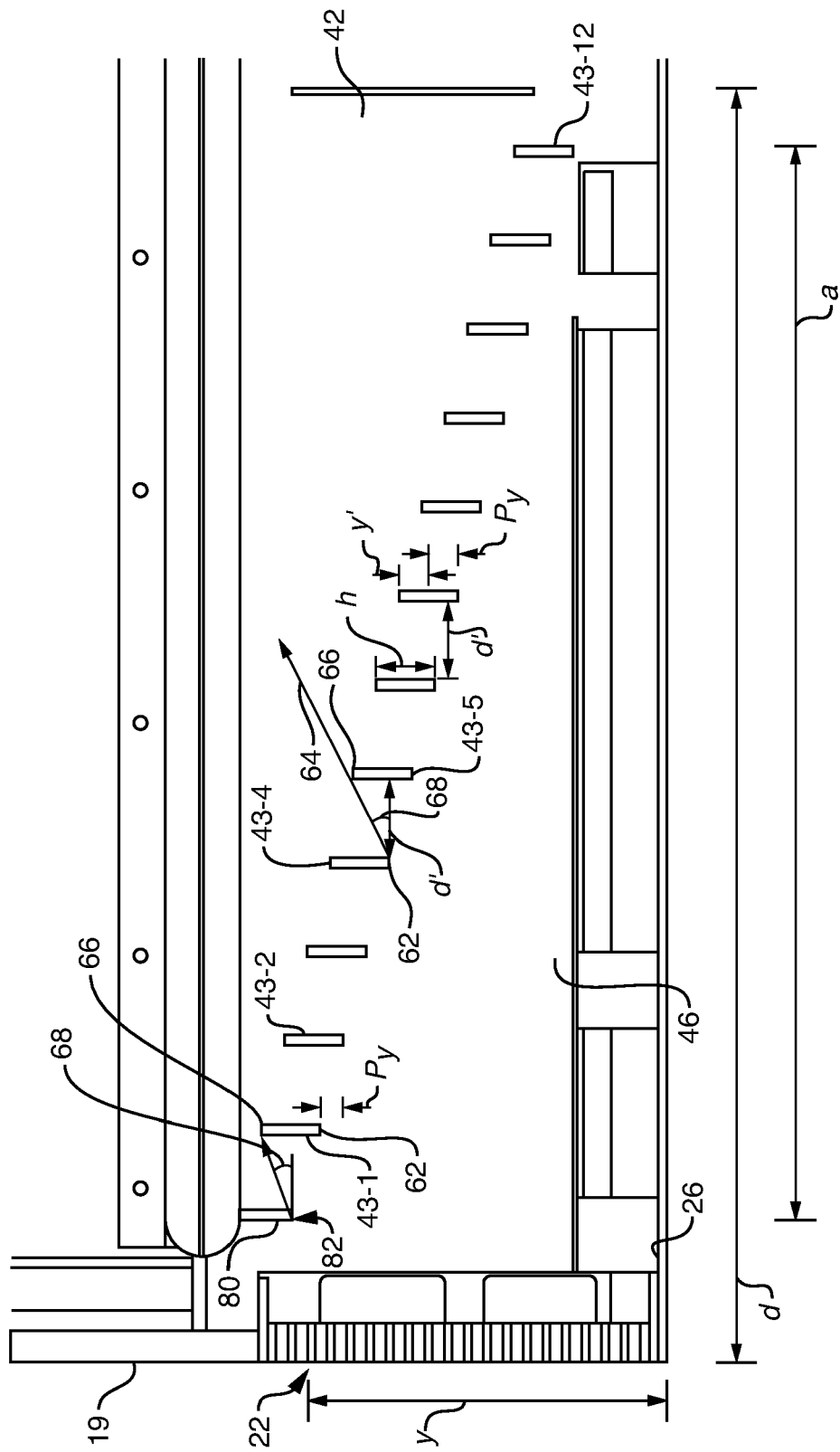
FIG. 4 illustrates a sectional view of a second set of baffles of the electronic device of FIG. 1, according to one embodiment of the invention.

As indicated above, each baffle element 43 of the first set of baffles 42 directs a distinct portion of the air stream 32 towards the circuit board 16 such that the air stream 32 flows in a substantially uniform manner across the planar surfaces 17-1, 17-2 of the circuit board 16. In one arrangement, as shown in FIGS. 2 and 4, in order to direct distinct portions of the air stream 32 across the circuit board 16 in such a manner, the baffle elements 43 are disposed in a stepwise or cascading configuration within the intake volume 46 relative to the air inlet 22. For example, in the embodiment shown in FIG. 4, the first set of baffles 42 includes twelve baffle elements 43-1 through 43-12 disposed serially within the intake volume 46 along distance d, each baffle element having substantially the same height h.

In the cascading configuration, the baffle element 43 are disposed within the intake volume 46 such that, for any two adjacently disposed baffle elements 43, a baffle element 43 that is located closest to the air inlet 22 (e.g., a forward baffle element) is disposed, relative to the base 26 of the chassis 12, above a baffle element 43 that is located closest to the rear wall 20 of the electronic device 10 (e.g., a rearward baffle element). For example, as shown in FIG. 4, for adjacent baffle elements 43-1 and 43-2, forward baffle element 43-1 (e.g., of the two adjacent baffle elements, the baffle element located closest to the air inlet 22) is disposed above rearward baffle element 43-2 (e.g., of the two adjacent baffle elements, the baffle element located closest to the rear wall 20 of the electronic device 10). With such positioning, a portion $P_y$ of the rearward baffle element 43-2, termed a vertical decrease, extends below a lower edge 62 of the forward baffle element 43-1.

Also in the cascading configuration shown in FIG. 4, the relative horizontal spacing of the adjacent baffle elements 43 along distance d aids in directing the air stream 32 to flow in a substantially uniform manner across the planar surfaces 17-1, 17-2 of the circuit board 16. In one arrangement, taking baffle elements 43-4 and 43-5 as an example of adjacent baffle elements 43, the adjacent baffle elements 43 are disposed within the inlet volume 46 at a relative horizontal pitch d' such that a line segment 64 defined between a bottom edge 62 of the forward baffle element 43-4 and a top edge 66 of a rearward baffle element 43-5 forms an angle 68, relative to the base 26 of the chassis 12, in a range of about 18 degrees to about 40 degrees and preferably in a range of about 23 degrees to about 28 degrees. Such relative positioning of the baffle elements 43 of the first set of baffles 42 causes the air stream 32 to flow toward the circuit boards 16 along a direction that is substantially orthogonal to the original direction of the flow of the air stream portion 32-1 into the air inlet 22. As a result, the first set of baffles 42 distribute the air stream 32, flowing through the air inlet 22, in a substantially even manner across the planar surfaces 17-1, 17-2 of the circuit boards 16 (e.g., across each card cage slot 15 along depth d).

While the relative positioning of each of the baffle elements 43 optimizes the angle 68 of a line segment defined between the bottom edge 62 of a forward baffle element and a top edge 66 of a rearward baffle element and relative to the base 26, in one arrangement, positioning of the first baffle element 43-1 within the inlet volume 46 of the chassis 12 can also be considered. For example, as illustrated in FIG. 4, the first baffle element 43-1 is disposed behind a wall portion 80 associated with the card cage 14. In order to allow the first baffle element 43-1 to redirect a portion of the air stream 32 toward the circuit board 16 while minimizing recirculation of the air stream within the chassis, the first baffle element 43-1 is disposed behind the wall portion 80 such that a line segment defined between a bottom edge 82 of the wall portion 80 and a top edge 66 of the first baffle element 43-1 forms an angle 68, relative to the base 26 of the chassis 12, in a range of about 18 degrees to about 40 degrees and preferably in a range of about 23 degrees to about 28 degrees.

In certain cases, the overall length d of the inlet volume 46 can vary. For instance, the overall depth d of the inlet volume 46 can vary between approximately 10 inches and 14 inches. In one arrangement, the number of baffles elements 43 forming the first set of baffles 42, along with the height h of each baffle element 43, can be scaled or adjusted to account for variations in the overall depth d of the inlet volume 46.

In order to determine a number of baffle elements 43 to be used within an inlet volume 46 of a chassis 12, and with reference to FIG. 4, a user can calculate the number of baffle elements 43, N, using the formula:

$$N = (a/d') - 1 \quad (1)$$

where a=the distance between the wall portion 80 and the location of the last baffle element 43-12 of the first set of baffles 42 (e.g., the desired location of the last baffle element 43-12) and d'=the user-selected, horizontal baffle element to baffle element pitch.

In order to determine the height of each baffle element 43 to be used within an inlet volume 46 of a chassis 12, and with reference to FIG. 4, a user first calculates a vertical rise value, Y', for each baffle element 43 using the formula:

$$Y' = d' \, \text{TAN(THETA)} \quad (2)$$

where d'=the user-selected, horizontal baffle element to baffle element pitch and THETA=an angle in a range of about 18 degrees to about 40 degrees and preferably in a range of about 23 degrees to about 28 degrees. Next, the user calculates a vertical decrease value, $P_y$, for each baffle element 43 using the formula:

$$P_y = Y^* (d'/d) \quad (3)$$

where Y=a height of the intake volume and d=the overall depth of the inlet volume. The user then calculates the height of each baffle element 43 using the formula:

$$H = Y' + P_y \quad (4).$$

While this invention has been particularly shown and described with references to preferred embodiments thereof, it will be understood by those skilled in the art that various changes in form and details may be made therein without departing from the spirit and scope of the invention as defined by the appended claims.

Figure 5:
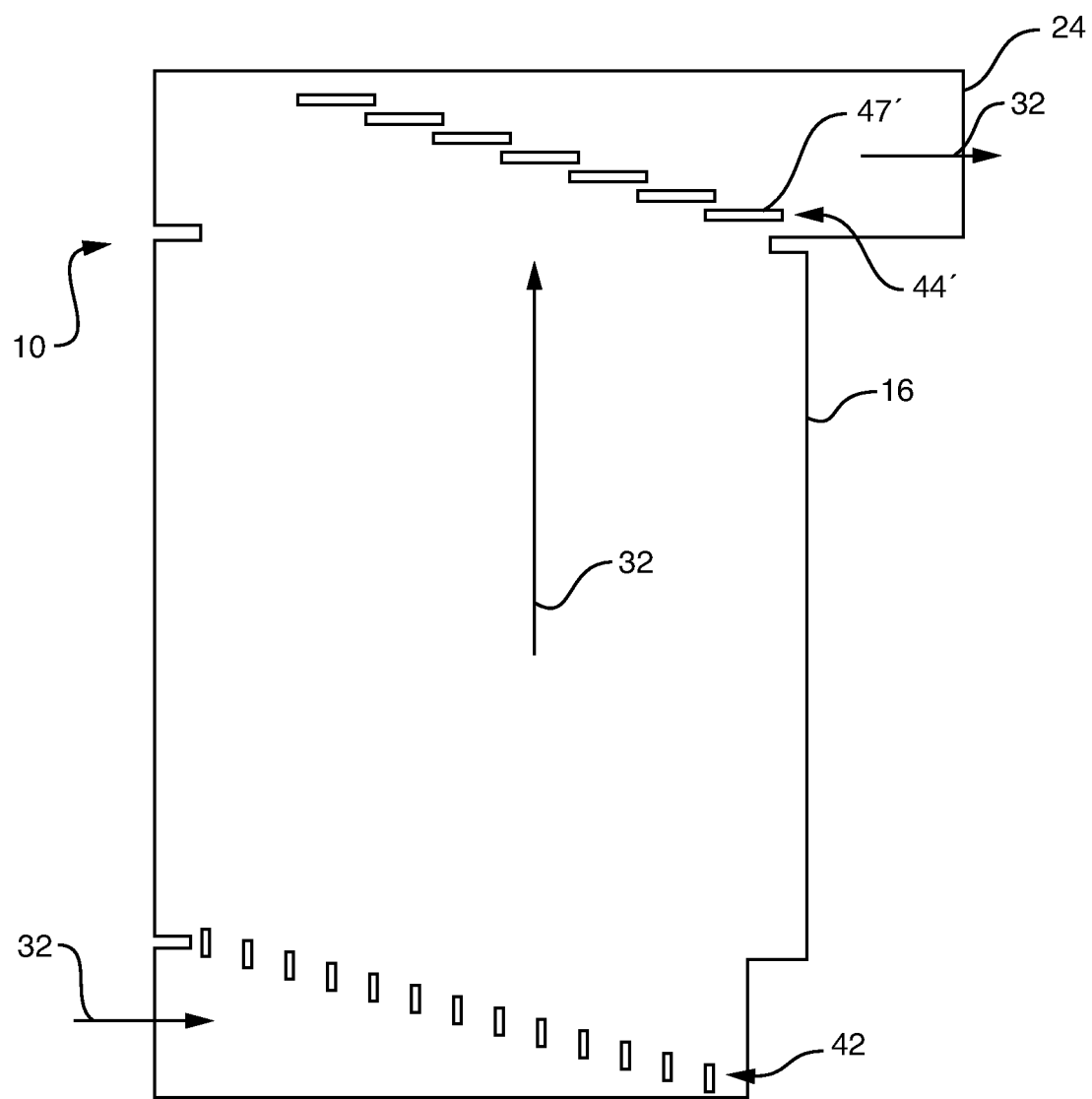
FIG. 5 illustrates a sectional view of a second set of baffles of the electronic device of FIG. 1, according to another embodiment of the invention.

For example, as indicated above, the second set of baffles 44 operate in conjunction with the first set of baffles to maintain a substantially even distribution of the air stream 32 across the planar circuit board component mounting surfaces 17-1, 17-2 of each circuit board 16. In one arrangement, the second set of baffles 44 includes three baffle elements 47-1 through 47-3, such as forked baffle elements, that provide a flow splitting capability relative to the air stream 32 flowing substantially parallel to the planar surfaces of the circuit boards 16 to help maintain such a substantially even distribution of the air stream 32 across the planar surface 17-1, 17-2 of the circuit boards 16. Such description is by way of example only. In one arrangement, as shown in FIG. 5, the second set of baffles 44' are disposed in a stepwise configuration relative to the circuit board 16 such that each baffle element 47' configured to direct the air stream 32 flowing from the circuit board 16 toward the air outlet 24. For example, as illustrated, the second set of baffles 44' turns the direction of the flow of the air stream 32 approximately 90 degrees toward the air outlet 24, relative to the direction of the flow of the air stream 32 across the circuit board mounting surfaces of the circuit board 16.

What is claimed is:

1. A method for distributing air flow in a chassis, comprising:
   disposing a first set of baffles within an intake volume defined by the chassis in a stepwise configuration, the chassis having a first wall, a second wall opposing the first wall, and a first side wall and a second side wall, the second side wall opposing the first side wall, the first side wall and the second side wall extending between the first wall and the second wall, a chassis cover on top of and extending between the first wall, the second wall, the first side wall, and the second side wall, a chassis base on bottom of and extending between the first wall, the second wall, the first side wall, and the second side wall, the chassis base opposing the chassis cover, relative to an air inlet defined by the first wall of the chassis, each baffle element of the first set of baffles extending along a length of the chassis between the first side wall and the second side wall and the each baffle element of the first set of baffles having a baffle face oriented substantially orthogonal to a direction of flow of an air stream through the air inlet;
   disposing a second set of baffles within an outtake volume defined by the chassis, the outtake volume opposing the intake volume, the second set of baffles having exactly three baffles, a first baffle element of the second set of baffles being positioned between the first wall of the chassis and the second wall of the chassis, a second baffle element of the second set of baffles being positioned between the first wall of the chassis and the first baffle element of the second set of baffles, and a third baffle element of the second set of baffles being positioned between the first baffle element of the second set of baffles and the second wall of the chassis;
   directing, by the first set of baffles, at least a portion of the air stream flowing from the air inlet along a first direction, the air inlet defined by the first wall of the chassis, to a second direction toward a circuit board disposed between the air inlet and an air outlet defined by the second wall of the chassis and disposed between the intake volume defined by the chassis and the outtake volume defined by the chassis, such that the air stream flows substantially parallel to a planar surface of the circuit board, the first direction being substantially orthogonal to each baffle face of the first set of baffles and the second direction being substantially orthogonal to the first direction; and dividing, by the second set of baffles, the air stream flowing in the second direction substantially parallel to the planar surface of the circuit board, into a plurality of air streams.

2. The method of claim 1, wherein directing the at least the portion of the air stream flowing along the first direction comprises directing by the each baffle element of the first set of baffles a distinct portion of the air stream flowing along the first direction relative to the air inlet defined by the first wall of the chassis, to the second direction toward the circuit board disposed between the air inlet and the air outlet.

3. The method of claim 2, wherein the each baffle element of the first set of baffles comprises a first face opposing the chassis cover and a second face opposing the first face and opposing the chassis base, the chassis cover and the chassis base each being substantially orthogonal to the first wall of the chassis and the second wall of the chassis, and wherein disposing the first set of baffles comprises arranging the first set of baffles within the chassis such that the first face of a first baffle element of the first set of baffles extends a first distance above the first face of an adjacently positioned second baffle element of the first set of baffles and the second face of the first baffle element of the first set of baffles extends a second distance above the second edge face of the adjacently positioned second baffle element of the first set of baffles, a height of the first baffle element of the first set of baffles being substantially equal to a height of the second baffle element of the first set of baffles.

4. The method of claim 1, further comprising directing, by the second set of baffles, the plurality of air streams along a third direction through the air outlet, the third direction being substantially orthogonal to the second direction.

5. The method of claim 1, wherein disposing the second set of baffles within the chassis further comprises disposing the second set of baffles within the chassis, each baffle element of the second set of baffles extending along the length of the chassis between the first side wall and the second side wall.

6. The method of claim 1, comprising: dividing, by the exactly three baffles of the second set of baffles, the air stream flowing substantially parallel to the planar surface of the circuit board into four substantially equal outlet air stream portions; and in response to dividing the air stream into the four substantially equal outlet air stream portions, maintaining a substantially even distribution of the air stream across the planar surface of the circuit board.

7. The method of claim 1, wherein dividing, by the second set of baffles, the air stream flowing in the second direction substantially parallel to the planar surface of the circuit board, into the plurality of air streams further comprises directing, by the second set of baffles, the plurality of air streams along a third direction toward a fan assembly, the third direction being substantially orthogonal to the second direction.

8. A method for distributing air flow in a chassis, comprising:

disposing a first set of baffles within an intake volume defined by the chassis in a stepwise configuration, the chassis having a first wall, a second wall opposing the first wall, and a first side wall and a second side wall, the second side wall opposing the first side wall, the first side wall and the second side wall extending between the first wall and the second wall, a chassis cover on top of and extending between the first wall, the second wall, the first side wall, and the second side wall, a chassis base on bottom of and extending between the first wall, the second wall, the first side wall, and the second side wall, the chassis base opposing the chassis cover, relative to an air inlet defined by the first wall of the chassis, each first baffle element of the first set of baffles having a length extending along a length of the chassis between the first side wall and the second side wall, the each first baffle element of the first set of baffles having a first baffle face oriented substantially orthogonal to a direction of flow of an air stream through the air inlet, and the each first baffle element of the first set of baffles defining a first rectangular cross-sectional profile, the first baffle face of the first rectangular cross-sectional profile being substantially parallel with the first wall;

disposing a second set of baffles within an outtake volume defined by the chassis, the outtake volume opposing the intake volume, each second baffle element of the second set of baffles extending along the length of the chassis between the first side wall and the second side wall, the each second baffle element of the second set of baffles having a second baffle face oriented substantially orthogonal to a direction of flow of the air stream from a circuit board disposed between the air inlet and an air outlet defined by the second wall of the chassis, the each second baffle element of the second set of baffles disposed between the intake volume defined by the chassis and the outtake volume defined by the chassis, and the each second baffle element of the second set of baffles defining a second rectangular cross-sectional profile, the second baffle face of the second rectangular cross-sectional profile being substantially parallel with the chassis base;

directing, by the first set of baffles, at least a portion of the air stream flowing along a first direction from the air inlet defined by the first wall of the chassis to a second direction toward the circuit board disposed between the air inlet and an air outlet defined by the second wall of the chassis such that the air stream flows substantially parallel to a planar surface of the circuit board, the first direction being substantially orthogonal to the each first baffle of the first set of baffles and the second direction being substantially orthogonal to the first direction;

receiving, by a second set of baffles disposed in proximity to the air outlet, the air stream flowing substantially parallel to the planar surface of the circuit board, the each second baffle element of the second set of baffles being substantially orthogonal to the air stream flowing along the second direction substantially parallel to the planar surface of the circuit board along the second direction; and dividing, by the second set of baffles disposed in proximity to the air outlet, the air stream flowing along the second direction substantially parallel to the planar surface of the circuit board, into a plurality of air streams.

9. The method of claim 8, wherein directing by the first set of baffles the at least the portion of the air stream flowing along the first direction relative to the air inlet defined by the first wall of the chassis further comprises, the each first baffle element of the first set of baffles having a first face opposing the chassis cover and a second face opposing the first face and opposing the chassis base, the first face of a first one of the each first baffle element of the first set of baffles extending a first distance above the first face of an adjacently positioned second one of the each first baffle element of the first set of baffles and the second face of the first one of the each first baffle element of the first set of baffles extending a second distance above the second face of the adjacently positioned second one of the each first baffle element of the first set of baffles and wherein a height of the first one of the each first baffle element of the first set of baffles is substantially equal to a height of the second one of the each first baffle element of the first set of baffles.

10. The method of claim 8, wherein dividing, by the second set of baffles disposed in proximity to the air outlet, the air stream flowing along the second direction substantially parallel to the planar surface of the circuit board, into a plurality of air streams further comprises directing, by the second set of baffles, the plurality of air streams along a third direction toward a fan assembly, the third direction being substantially orthogonal to the second direction.

11. The method of claim 8, comprising directing, by the second set of baffles, the plurality of air streams along a third direction through the air outlet, the third direction being substantially orthogonal to the second direction, the each second baffle element of the second set of baffles having a first face opposing the first wall of the chassis and a second face opposing the first face and opposing the second wall of the chassis, the first face of a first one of the each second baffle element of the second set of baffles extending a first distance above the first face of an adjacently positioned second one of the each second baffle element of the second set of baffles and the second face of the first one of the each second baffle element of the second set of baffles extending a second distance above the second face of the adjacently positioned second one of the each second baffle element of the second set of baffles and wherein a height of the first one of the each second baffle element of the second set of baffles is substantially equal to a height of the second one of the each second baffle element of the second set of baffles.

\* \* \* \* \*